(12) United States Patent
Otremba et al.

(10) Patent No.: US 9,373,566 B2
(45) Date of Patent: Jun. 21, 2016

(54) HIGH POWER ELECTRONIC COMPONENT WITH MULTIPLE LEADFRAMES

(71) Applicant: Infineon Technologies Austria AG, Villach (AT)

(72) Inventors: Ralf Otremba, Kaufbeuren (DE); Klaus Schiess, Allensbach (DE); Teck Sim Lee, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 28 days.

(21) Appl. No.: 14/219,574

(22) Filed: Mar. 19, 2014

(65) Prior Publication Data

US 2015/0270194 A1  Sep. 24, 2015

(51) Int. Cl.
*H01L 23/49* (2006.01)
*H01L 23/495* (2006.01)
*H01L 23/00* (2006.01)

(52) U.S. Cl.
CPC .... *H01L 23/49503* (2013.01); *H01L 23/49541* (2013.01); *H01L 23/49562* (2013.01); *H01L 24/73* (2013.01); *H01L 23/49524* (2013.01); *H01L 23/49551* (2013.01); *H01L 23/49568* (2013.01); *H01L 2224/16245* (2013.01); *H01L 2224/48091* (2013.01); *H01L 2224/48247* (2013.01); *H01L 2224/48472* (2013.01); *H01L 2224/49175* (2013.01); *H01L 2224/73257* (2013.01); *H01L 2924/13055* (2013.01); *H01L 2924/13091* (2013.01); *H01L 2924/181* (2013.01)

(58) Field of Classification Search
CPC ........... H01L 2224/48247; H01L 2224/48091; H01L 23/49541
See application file for complete search history.

(56) References Cited

U.S. PATENT DOCUMENTS

| 6,066,515 A * | 5/2000 | Schoenfeld ......... H01L 23/4951 257/666 |
| 6,404,041 B1 | 6/2002 | Gantioler et al. |
| 8,044,523 B2 | 10/2011 | Otremba |
| 2006/0017174 A1 | 1/2006 | Otremba |
| 2007/0215996 A1 * | 9/2007 | Otremba ........................ 257/678 |
| 2012/0299119 A1 * | 11/2012 | Xue et al. ...................... 257/401 |

FOREIGN PATENT DOCUMENTS

| DE | 19806817 C1 | 7/1999 |
| DE | 102004021054 A1 | 11/2005 |
| DE | 102004030042 A1 | 1/2006 |

OTHER PUBLICATIONS

"Semiconductor Packages Having Multiple Lead Frames and Methods of Formation Thereof," U.S. Appl. No. 13/544,834.

* cited by examiner

*Primary Examiner* — Jerome Jackson, Jr.
*Assistant Examiner* — Charles R Peters
(74) *Attorney, Agent, or Firm* — Murphy, Bilak & Homiller, PLLC

(57) ABSTRACT

In an embodiment an electronic component includes a semiconductor die having a first surface, the first surface including a first current electrode and a control electrode. The electronic component further includes a die pad having a first surface, a plurality of leads and a gull-wing shaped conductive element coupled to a first lead of the plurality of leads. The first current electrode is mounted on the die pad and the gull-wing shaped conductive element is coupled between the control electrode and the first lead.

18 Claims, 3 Drawing Sheets

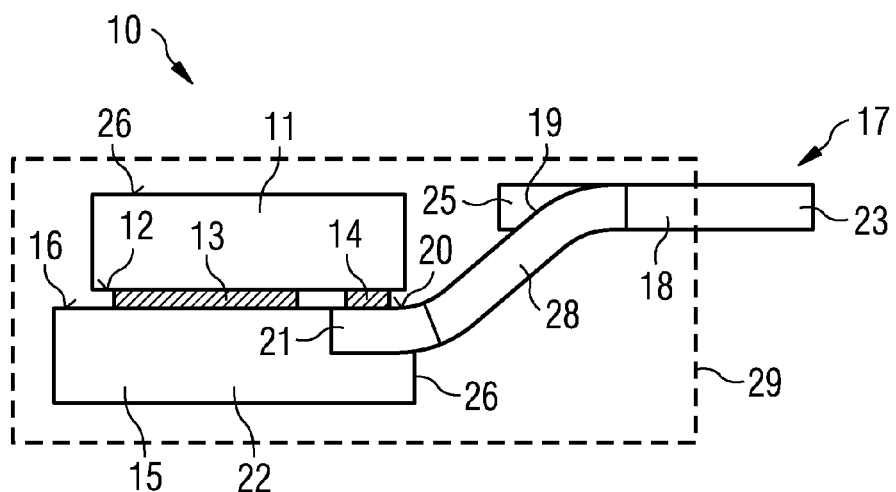
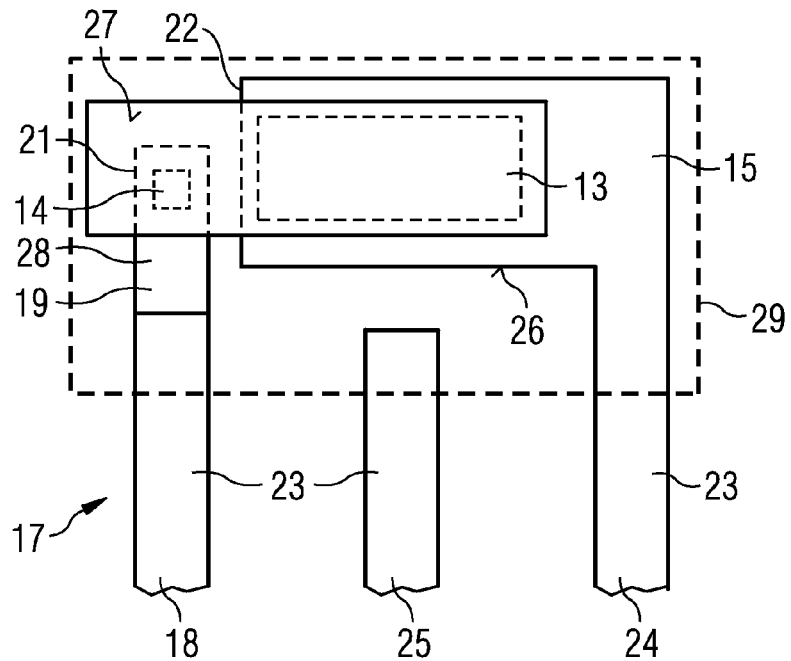

HIGH POWER ELECTRONIC COMPONENT WITH MULTIPLE LEADFRAMES

BACKGROUND

An electronic component may include one or more semiconductor devices in a package. The package includes internal electrical connections from the semiconductor device to a substrate or a leadframe which includes outer contacts. The outer contacts are used to mount the electronic component on a redistribution board, such as a printed circuit board. The package may include a housing which covers the semiconductor device and the internal electrical connections.

SUMMARY

In an embodiment, an electronic component includes a semiconductor die having a first surface, the first surface including a first current electrode and a control electrode. The electronic component further includes a die pad having a first surface, a plurality of leads and a gull-wing shaped conductive element coupled to a first lead of the plurality of leads. The first current electrode is mounted on the die pad and the gull-wing shaped conductive element is coupled between the control electrode and the first lead.

In an embodiment, a leadframe includes at least one component position. The component position includes a die pad and a plurality of leads arranged adjacent a side of the die pad. A first lead of the plurality of leads includes a first end having a first surface that is substantially coplanar with a first surface of the die pad and spaced at a distance from the die pad and a second end that is arranged in a plane spaced at a distance from the first surface of the die pad.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 illustrates a cross-sectional view of an electronic component according to a first embodiment.

FIG. 2 illustrates a top view of an electronic component according to the first embodiment.

DETAILED DESCRIPTION

Figure 3:
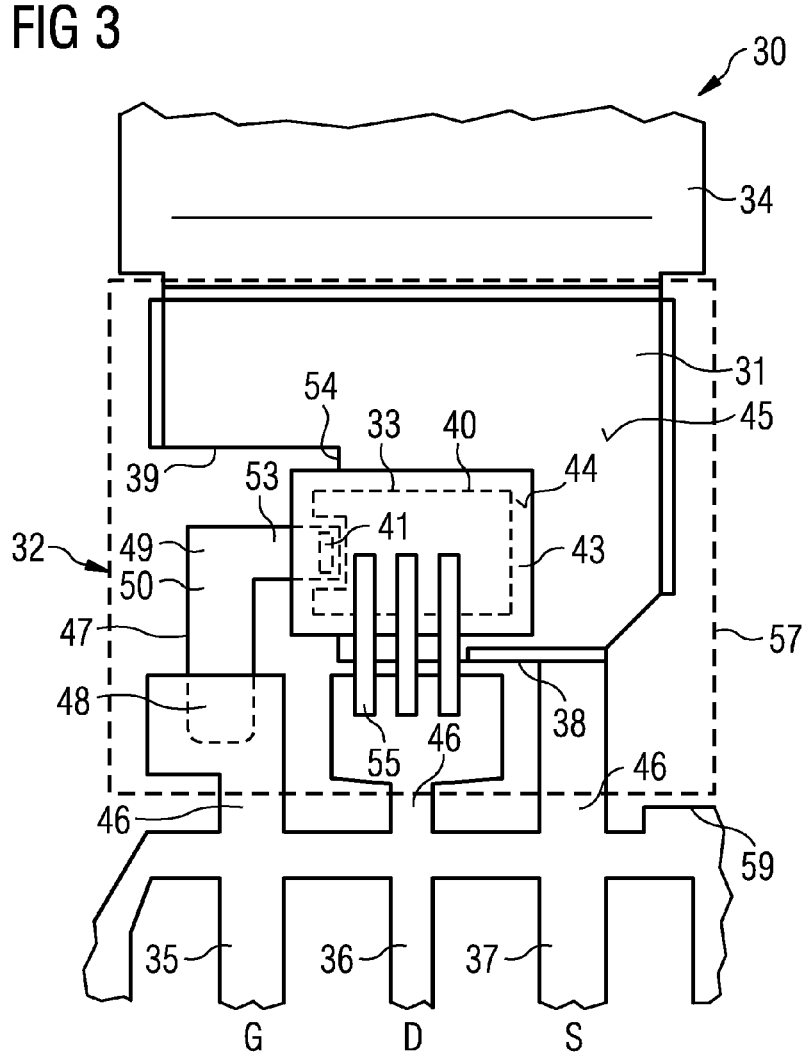
FIG. 3 illustrates a top view of an electronic component according to a second embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

FIG. 1 illustrates a cross-sectional view and FIG. 2 illustrates a top view of an electronic component 10 according to a first embodiment.

The electronic component 10 includes a semiconductor die 11 having a first surface 12, a die pad 15 having a first surface 16 and a plurality of leads 17 of which only a first lead 18 can be seen in the cross-sectional view of FIG. 1. The electronic component 10 further includes a gullwing shaped conductive element 19 which is coupled to the first lead 18. A first current electrode 13 and a control electrode 14 are arranged on the first surface 12 of the semiconductor die 11. The first current electrode 13 is mounted on the first surface 16 of the die pad 15 and the gullwing shaped conductive element 19 is coupled between the control electrode 14 and the first lead 18.

The gullwing shaped conductive element 19 provides a portion of the internal redistribution structure of the electronic component 10. The gullwing shaped conductive element 19 includes a first end portion 21 that is arranged under at least the control electrode 14 of the semiconductor die 11 and a second end portion or distal portion 23 that is substantially parallel to the first end portion 21 and is arranged in a plane which is spaced apart and above the first surface 16 of the die pad 15. A central portion 28 couples the first end portion 21 to the second end portion 23. In this embodiment, the central portion 28 is curved so that the gullwing shaped conductive element 19 may be considered as having a substantially S-shape. At least the first end portion 21 and the central portion 28 are positioned within the package housing, indicated with the dashed line 29, and provide an internal contact area rather than an outer contact area.

The control electrode 14 is mounted on an upper surface 20 of the first end portion 21 of the gullwing shaped conductive element 19. The first surface 20 of the gullwing shaped element 19 and the first surface 16 of the die pad 15 are substantially coplanar. The first end portion 21 of the gullwing shaped conductive element 19 is positioned adjacent and spaced apart form a side face 22 of the die pad 15. The semiconductor die 11 extends between the die pad 15 and the gullwing shaped conductive element 19.

Each of the plurality of leads 17 includes a second end portion or distal portion 23 which is arranged in a plane spaced at a distance from the first surface 16 of the die pad 15. In the cross-sectional view illustrated in FIG. 1, the distal portions 23 of the plurality of leads 17 are positioned in a plane above the first surface 16 of the die pad 15.

The shape of the gullwing shaped conductive element 19 provides a redistribution structure for the control electrode 14 within the package housing 29. The control electrode 14 is substantially coplanar with the first surface 16 of the die pad 15 and is arranged adjacent, and spaced apart from, the side face 22 of the die pad 15. The control electrode 14 faces downwardly in the cross-sectional view illustrated in FIG. 1.

The first surface 20 of the first end portion 21 of the gullwing shaped conductive element 19 is substantially planar and is positioned underneath the semiconductor die 11 such that the upper surface 20 of the first end portion 21 is substantially coplanar with the first surface 16 of the die pad 15. The gullwing shaped conductive element 19 extends from the control electrode 14 upwardly to the distal portion 23 of the first lead 18 which is positioned in a plane which is above the plane of the control electrode 14.

In the electronic component 10 according to the first embodiment, the gullwing shaped conductive element 19 is formed by a proximal portion of the first lead 18 which has a form such that it extends from a plane above that of the first surface 16 of the die pad 15 towards the first surface 16 of the die pad 15 and has a first end portion 21 having a surface 20 which is substantially coplanar with the first surface 16 of die pad 15. The first surface 20 of the first end portion 21 serves as a mounting surface for the control electrode 14 and the gullwing shaped conductive element 19 electrically couples the control electrode 14 to the first lead 18.

As can be seen in the top view of FIG. 2, the electronic component 10 includes three leads, whereby the first lead 18 is a first outermost lead of the three leads. A second outermost lead 24 of the three leads extends from the die pad 15 and a centre lead 25 is spaced at a distance from a second side face 26 of the die pad. The second side face 26 is substantially perpendicular to the first side face 22 adjacent which the gullwing conductive element 19 is arranged. The distal portion 23 of the second outermost lead and the centre lead 25 are arranged in a common plane with the distal portion 23 of the first outermost lead 18. This common plane is arranged above the first surface 16 of the die pad 15. The second outermost lead 24 provides an electrical contact to the first current electrode 13 which is mounted on, and electrically coupled to, the first surface 16 of the die pad 15.

The semiconductor die 11 may include a transistor device such as a power transistor device including a vertical drift path. In these embodiments, the second major surface 27 of the transistor device, which opposes the first major surface 12, includes a second current electrode which may be electrically coupled to the centre lead 25 by conductive elements such as bond wires or contact clips.

The semiconductor die may 11 may include a transistor device, such as a power transistor device having a vertical drift path. The power transistor device may include a MOSFET, an Insulated Gate Bipolar Transistor (IGBT) or a Bipolar Junction Transistor (BJT). For MOSFET devices, the first current electrode 13 may be a source electrode, the control electrode 14 may be a gate electrode and the second current electrode may be a drain electrode. For IGBT devices, the first current electrode 13 may be an emitter electrode, the control electrode 14 may be a gate electrode and the second current electrode may be a collector electrode. For BJT devices, the first current electrode 13 may be an emitter electrode, the control electrode 14 may be a base electrode and the second current electrode may be a collector electrode.

The arrangement of the plurality of leads 17 illustrated in FIG. 2 enables a transistor device to be mounted in a so-called "source down" arrangement in which the source electrode is the first current electrode 13 and is mounted on the die pad 15 and the control electrode 14, which is the gate electrode, is electrically coupled to the first lead 18. The drain electrode is electrically connected to the centre lead 25 so that the electronic component 10 has a standard pinning order of Gate, Drain, Source.

The gullwing shaped conductive element 19 may include a first end portion 21 coupled to the control electrode 14 arranged coplanar to the die pad, a second end portion 23 that is coupled to the first lead and a bent portion 28 arranged between the first end portion 21 and the second end portion 23. The second end portion 23 of the gullwing shaped conductive element 19 may be attached to an upper surface or a lower surface of the first lead, for example by a spot weld joint.

In some embodiments, such as that illustrated in FIGS. 1 and 2, the second end portion 23 of the gullwing shaped conductive element 19 is integral with the first lead 18. In these embodiments, the first lead 18 and gullwing shaped conductive element 19 may be formed by deep drawing.

In some embodiments, the gullwing shaped conductive element 19 is coplanar with the die pad 15. In other embodiments, only the first surface 20 of the gullwing conductive element 19 is substantially coplanar with the first surface 16 of the die pad 15. In these embodiments, the thickness of the gullwing shaped conductive element 19 can be less than the thickness of the die pad 15.

The die pad 15 may have various forms. For example, the die pad 15 may be substantially rectangular or square, in some embodiments, the die pad 15 may include a cut-out in which material has been removed. For example, the die pad 15 may include a cut-out in which material has been removed from one corner of a substantially rectangular or square die pad such that the die pad 15 has a substantially L-shape. The first end portion 21 of the gullwing conductive element 19 may be positioned within this cut-out such that it is spaced at a distance from the die pad 15. In these embodiments, the first end portion 21 of the gullwing shaped conductive element 19 is arranged adjacent, and spaced apart from, two side faces of the die pad 15. In these embodiments, the die pad 15 can be thought us having an L-shape contour within the package housing 29.

In some embodiments, the first end portion of the gullwing shaped conductive element 19 has an L-shaped configuration. This form may be used to provide a redistribution structure between the control electrode 14 to the first lead 18 which extends in a lateral direction in the plane of the die pad 15 and in directions from the plane of the upper surface 16 of the die pad 15 to the distal portions 23 of the plurality of leads 17.

The electronic component 10 may conform to a JEDEC package outline, for example a TO-220 or a TO-247 outline.

The electronic component 10 may include more than one semiconductor die, for example two transistor devices, such as two MOSFET devices, or a transistor device and a diode, for example a IGBT and a diode.

The die pad 15 and the plurality of leads 17 may be provided in the form of a component position of a leadframe, in which adjacent component positions are coupled to one another by coupling strips. The leads 17 within a component composition may also be supported by coupling strips, for example coupling strips extending between adjacent leads. The coupling strips may be removed after molding of the electronic component to separate the leads from one another and each electronic component from its component position of the leadframe.

Each of the component positions may include a die pad 15 and a plurality of leads 17 arranged adjacent a single side of the die pad 15. The first lead 18 of the plurality of leads 17 includes a first end portion 21 having a first surface 20 which is substantially coplanar with a first surface 16 of the die pad 15 and which is spaced at a distance from the die pad 15 and a second end portion 23 that is arranged in a plane spaced at a distance from the first surface 16 of the die pad 15, for example above the first surface 16 of the die pad 15.

The first lead 18 may form a first outermost lead. A further lead 24 may extend from the die pad 15. The lead 24 extending from the die pad 15 may form a second outermost lead of the component position. A centre lead 25 may be arranged between the two outermost leads 18, 24 and may be spaced apart from the die pad 15.

The first surface 16 of the die pad 15 may be used as the mounting surface for the first current electrode 13 of the semiconductor die 11 and the first surface 20 of the first end portion 21 of the gullwing shaped conductive element 19 may provide a mounting surface of the control electrode 14 of the semiconductor die 11.

The first lead 18 may be attached to a further lead portion by a joint. The joint may be formed by spot welding, or soldering by means of a solder having a melting point higher than that used to mount the semiconductor die to the die pad and leads may also be used.

The first lead may be formed by deep drawing or otherwise mechanically deforming the first lead such that it extends between two planes.

Figure 4:
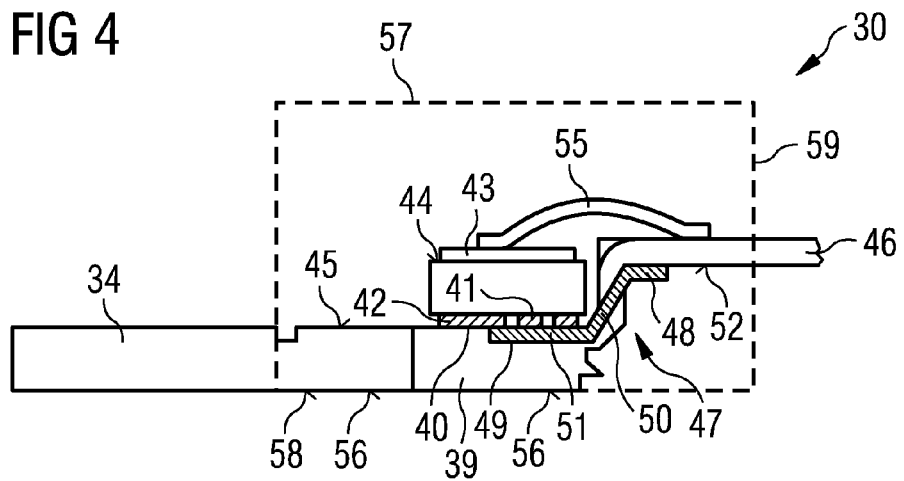
FIG. 4 illustrates a cross-sectional view of the electronic component of the second embodiment.

FIG. 3 illustrates a top view and FIG. 4 a cross-sectional view of an electronic component 30 according to a second embodiment. In this embodiment, the electronic component 30 has a TO-220 package outline. However, the electronic component is not limited to this particular package outline and may have a different outline which may conform to a JEDEC package outline.

The electronic component 30 includes a die pad 31, an internal redistribution structure 32 and a semiconductor die 33. The die pad 31 includes a heat sink portion 34 which remains outside of the package housing. The electronic component 30 further includes a plurality of leads, in particular three leads 35, 36 and 37 which are arranged adjacent an opposing side face 38 of the die pad 31 from the heatsink 34. The die pad includes a recess 39 formed in a corner facing the first outermost lead 35 such that the die pad 31 has substantially an L-shape. The second outermost lead 37 extends from the die pad 31 and a centre lead 36 is arranged between the outermost leads 35, 37, adjacent to, and spaced apart from, the side face 38 of the die pad 31.

The outer contour of the die pad 31 and the internal redistribution structure 32 of a TO-220 JEDEC package may be reconfigured to enable a vertical power transistor device 33 such as a vertical power MOSFET device to be mounted in a so-called source down arrangement whilst retaining the standard pinning arrangement of Gate, Drain and Source. A source down arrangement, as opposed to a drain down arrangement, may be used to reduce or avoid interference currents which may arise if the drain is mounted on the die pad.

In this embodiment, the semiconductor die 33 includes a MOSFET device and includes a first current electrode 40, in the form of a source electrode, and a control electrode 41, in the form of a gate electrode, on a first major surface 42. The semiconductor die 33 includes a second current electrode 43, in this embodiment a drain electrode, on the opposing major surface 44. The first current electrode 40 is mounted on the upper surface 45 of the die pad 31 and the control electrode 41 is positioned in the recess 39 of the die pad 31.

The leads 35, 36, 37 each have a distal portion 46 which is positioned above the upper surface 45 of the die pad 31. These distal portions 46 provide the outer contacts of the electronic component 30 with which the electronic component can be mounted on, and electrically coupled, to a printed circuit board. The centre lead 36 may be positioned entirely in the plane of the distal portion 46 of the first outermost lead 36 and of the second outermost lead 37. The proximal portion of the centre lead 36, which is adjacent the side face 38 of the die pad 15, is positioned in a plane above the plane of the upper surface 45 of the die pad 31.

The redistribution structure 32 from the control electrode 41 to the first outermost lead 35 includes a conductive element 47 having a distal portion 48 which is coupled to the distal portion 46 of the first outermost lead 35 and a proximal portion 49 which is coupled to the control electrode 41. The conductive element 47 has a linking portion 50 extending between the proximal portion 49 and the distal portion 48 of the conductive element 48. The proximal portion 49 is arranged in the recess 39 and is spaced part from the die pad 31. The proximal portion 49 has an upper surface 51 which is substantially coplanar with the upper surface 45 of the die pad 31. The distal portion 48 is mounted on the lower surface 52 of the distal portion 46 of the first outermost lead 35 in order to electrically couple the conductive element 47 to the first outermost lead 35 and the control electrode 41 to the first outermost lead 35.

As can be seen in the top view illustrated in FIG. 3, the proximal portion 49 of the conductive element 47 further includes a protruding portion 53 extending substantially coplanar with the upper surface 45 of the die pad 31 and substantially perpendicular to the length of the linking portion 50 towards the die pad 31. The protruding portion 53 provides a lateral redistribution structure between the control electrode 41 and the lead 33. In the top view illustrated in FIG. 3, the conductive element 47 has a substantially L-shape.

The finger-like protruding portion 53 of the conductive element 47 is arranged to extend substantially perpendicularly to the side face 54 such that the outermost end of the conductive element 47 protrudes under the semiconductor die 33 and, in particular, under the control electrode 41 such that it remains uncovered by the source electrode 40.

The position of the control electrode 41 in the recess 39 and the distance of the control electrode 41 from the first outermost lead 35 may vary, for example depending on the lateral size of the semiconductor die 33. The protruding finger-like portion 53 of the conductive element 47 may have an extent configured to accommodate differing positions of the control electrode 41 and semiconductor dies 33, for example transistor devices, of differing lateral size.

The drain electrode 43 of the transistor device 33 is electrically coupled to the centre lead 36 by one or more conductive members 55, such as one or more bond wires or a contact clip. The electronic component 30 further includes a package housing 57 which encapsulates the upper surface 45 of the die pad 31, the semiconductor die 33, the conductive element 47, the bond wires and the proximal portions of the leads 35, 36 and 37. The heat sink portion 34 and the lower surface 56 of the die pad 31 remain exposed from the package housing 57. The distal portions 46 of the lead 35, 36, 37 protrude from the side face 59 of the package housing 57. The package housing 57 includes a moulding compound such as epoxy resin which also provides electrical insulation between the leads 35, 36, 37.

The die pad 31, the heatsink 34 and the leads 35, 36, 37 may include copper. The mounting surfaces may include a mounting layer including a material which is suitable for providing an appropriate joint to the first current electrode 40 and/or control electrode 41. For example, if a soft solder is to be used to mount the first current electrode 40 onto the die pad 31 and the control electrode 40 onto the protruding portion 53 of the internal redistribution structure 32, the mounting layer may include a material that is wettable by solder, for example Ni/Au.

If a conductive element 55 in the form of a bond wire is used to electrically couple the second current electrode 43 to a lead, for example the centre lead 36, then the contact area portion of the centre lead 36 may include a material suitable for forming a reliable joint to a bond wire, such as a NiP alloy. The mounting layers are not limited to a single layer and may include two of more layers of differing materials. If a conductive element in the form of a contact clip is used to electrically couple the second current electrode to a lead, the mounting layer may include a material that is wettable by solder.

The first current electrode 40, the second current electrode 43 and the control electrode 41 may each include a metallic pad. The metallic pad may include one or more layers in order to provide a reliable connection to the underlying transistor structure and a reliable bond to the connecting elements of the electronic component, such as the die pad 31, redistribution structure 32 and conductive element 55. The metallic pads may include copper.

Figure 5:
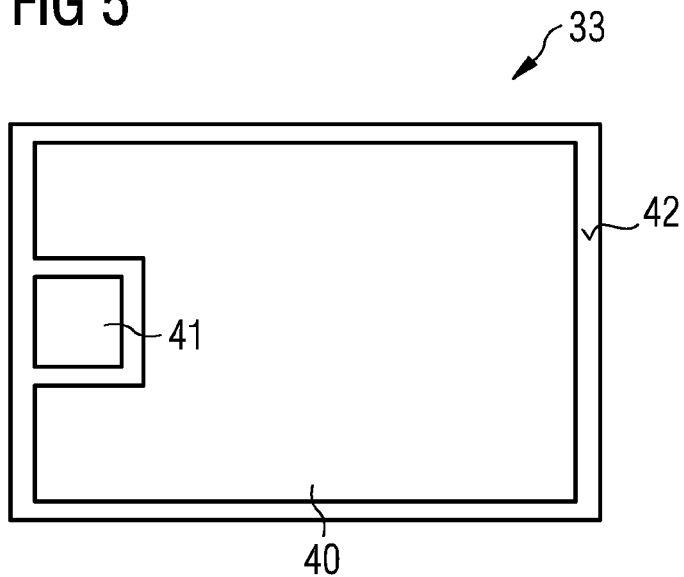
FIG. 5 illustrates a top view of a semiconductor die.

FIG. 5 illustrates a plan view of the first major surface 42 of the semiconductor die 33 and illustrates the arrangement of the first current electrode 40 and the control electrode 41. The control electrode 41 is positioned approximately in the centre of an edge region of the first major surface 42 of the semiconductor die 33 and is surrounded on three sides by portion 50 of the first current electrode 40 which covers substantially the remainder of the major surface 42. The control electrode 41 is electrically insulated from the first current electrode by regions of a dielectric layer, for example.

Figure 6:
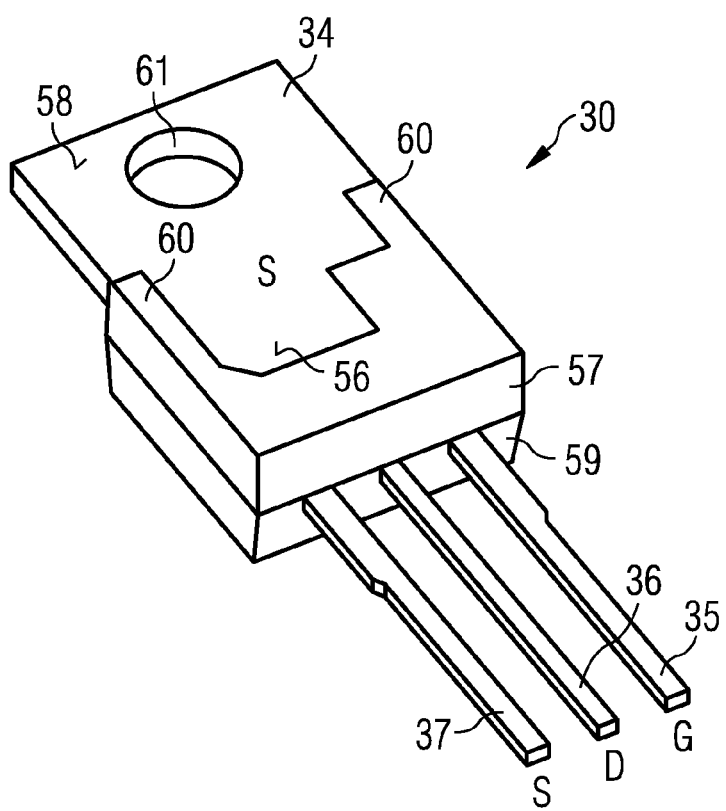
FIG. 6 illustrates a perspective view of the electronic component according to the second embodiment.

FIG. 6 illustrates a perspective view of the electronic component 30 according to the second embodiment and, in particular, a perspective view of the lower surface 58 of the electronic component 30. The lower surface 56 of the die pad 31 remains exposed from the insulating material forming the housing 57 in central regions. The edge regions 60 of the die pad 31 are covered by the insulating material of the package housing 57. The insulating material covering the edge regions 60 of the die pad 31 is substantially coplanar with the lower surface 56 of the die pad 31. The lower surface 58 of the die pad 31 may include a step in the peripheral edge regions in which the insulation material of the package housing 57 may be arranged. The heat sink 34 includes a hole 61 which may be used to mechanically fix the heat sink to a further component, for example an external heat sink.

In this embodiment, the lower surface 56 of the die pad 31 and the heat sink 34 are coupled to source potential, since the source electrode is mounted on, and electrically coupled to, the upper surface 45 of the die pad 31.

In other embodiments, the lower surface 56 of the die pad 31 is covered with the insulating material of the package housing 55. In yet further embodiments, the lower surface of the die pad 31 and the heat sink are covered with the insulating material of the housing 55.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component, comprising:
    a semiconductor die having a first surface, the first surface comprising a first current electrode and a control electrode;
    a die pad comprising a first surface;
    a plurality of leads, and
    a gull-wing shaped conductive element coupled to a first lead of the plurality of leads by a spot weld connection, wherein the first current electrode is mounted on the die pad and the gull-wing shaped conductive element is coupled between the control electrode and the first lead,
wherein the gull-wing shaped conductive element comprises a first end having a first surface that is substantially coplanar with the first surface of the die pad,
wherein the semiconductor die extends between the die pad and the first end of the gull-wing shaped conductive element,
wherein the gull-wing shaped conductive element is provided as a separate piece from the first lead of the plurality of leads,
wherein the die pad has an L-shaped configuration in plan view.

2. The electronic component according to claim 1, wherein the gull-wing shaped conductive element comprises a first end portion coupled to the control electrode and arranged coplanar to the die pad, a second end portion coupled to the first lead and a bent portion arranged between the first end portion and the second end portion.

3. The electronic component according to claim 1, wherein the first lead is an outermost lead of the plurality of leads.

4. The electronic component according to claim 1, wherein the gull-wing shaped conductive element is attached to a surface of the first lead that faces towards the die pad or the gull-wing shaped conductive element is attached to a surface of the first lead that faces away from the die pad.

5. The electronic component according to claim 1, wherein the first lead is formed by a deep drawn part of the gull-wing shaped element.

6. The electronic component according to claim 1, wherein the plurality of leads are part of a conductive leadframe with standard pinning.

7. The electronic component according to claim 1, wherein the semiconductor die includes a high voltage device.

8. The electronic component according to claim 1, wherein the semiconductor die comprises a transistor device.

9. The electronic component according to claim 1, wherein the semiconductor die comprises one of the group consisting of a MOSFET, a IGBT and a BJT.

10. The electronic component according to claim 1, wherein the gull-wing shaped conductive element comprises a first end portion spaced apart from the die pad.

11. The electronic component according to claim 10, wherein the first end portion comprises an L-shaped configuration.

12. The electronic component according to claim 10, wherein the first end portion is arranged adjacent two side faces of the die pad.

13. The electronic component according to claim 1, wherein the electronic component conforms to a JEDEC package outline.

14. The electronic component according to claim 1, wherein a thickness of the gull-wing shaped conductive element is less than a thickness of the first lead.

15. An electronic component, comprising:
a semiconductor die having a first surface, the first surface comprising a first current electrode and a control electrode;
a die pad comprising a first surface;
a plurality of leads; and
a gull-wing shaped conductive element coupled to a first lead of the plurality of leads,
wherein the first current electrode is mounted on the die pad and the gull-wing shaped conductive element is coupled between the control electrode and the first lead,
wherein the gull-wing shaped conductive element comprises a first end having a first surface that is substantially coplanar with the first surface of the die pad,
wherein the gull-wing shaped conductive element comprises a first end portion spaced apart from the die pad,
wherein the gull-wing shaped conductive element is provided as a separate piece from the first lead of the plurality of leads and has an L-shape in plan view such that the first end portion is coplanar with the die pad and extends perpendicularly to a direction in the plan view of a middle portion of the gull-wing shaped conductive element.

16. The electronic component according to claim 15, wherein a thickness of the gull-wing shaped conductive element is less than a thickness of the first lead.

17. An electronic component package, comprising:
a semiconductor die having a first surface, the first surface comprising a first current electrode and a control electrode;
a die pad comprising a first surface;
a plurality of leads; and
a gull-wing shaped conductive element coupled to a first lead of the plurality of leads,
wherein the first current electrode is mounted on the die pad and the gull-wing shaped conductive element is coupled between the control electrode and the first lead,
wherein the gull-wing shaped conductive element extends a distance within the package such that the gull-wing shaped conductive element has a first end portion adjacent a first side face of the die pad and the other leads are arranged adjacent a second side face of the die which is substantially perpendicular to the first side face.

18. An electronic component, comprising:
a semiconductor die having a first surface, the first surface comprising a first current electrode and a control electrode;
a die pad comprising a first surface;
a plurality of leads, and
a gull-wing shaped conductive element coupled to a first lead of the plurality of leads by a spot weld connection,
wherein the first current electrode is mounted on the die pad and the gull-wing shaped conductive element is coupled between the control electrode and the first lead,
wherein the gull-wing shaped conductive element comprises a first end having a first surface that is substantially coplanar with the first surface of the die pad,
wherein the semiconductor die extends between the die pad and the first end of the gull-wing shaped conductive element,
wherein the gull-wing shaped conductive element is provided as a separate piece from the first lead of the plurality of leads,
wherein a thickness of the gull-wing shaped conductive element is less than a thickness of the first lead.

* * * * *